United States Patent
Bailey (12) 
(10) Patent No.: US 6,430,810 B1
(45) Date of Patent: Aug. 13, 2002

(54) MECHANICAL SCRIBING METHODS OF FORMING A PATTERNED METAL LAYER IN AN ELECTRONIC DEVICE

(75) Inventor: Phillip Bailey, Goleta, CA (US)

(73) Assignee: Uniax Corporation, Santa Barbara, CA (US)

( * ) Notice: Subject to any disclaimer, the term of this patent is extended or adjusted under 35 U.S.C. 154(b) by 0 days.

(21) Appl. No.: 09/163,715

(22) Filed: Sep. 30, 1998

Related U.S. Application Data (60) Provisional application No. 60/063,427, filed on Oct. 28, 1997.

(51) Int. Cl.[7] .............................. H05K 3/02; H05K 3/10
(52) U.S. Cl. .............................. 29/846; 29/825; 29/829; 29/831; 29/835; 29/847; 83/875; 83/880; 83/886
(58) Field of Search .......................... 29/825, 829, 831, 29/835, 846, 847; 83/875, 880, 886

(56) References Cited

U.S. PATENT DOCUMENTS

| | | | | |
|---|---|---|---|---|
| 3,593,615 A | * | 7/1971 | Shelton | 90/13.1 |
| 3,699,644 A | * | 10/1972 | Cocca | 29/257.2 |
| 4,033,027 A | | 7/1977 | Fair et al. | |
| 4,202,914 A | * | 5/1980 | Havas | 427/38 |
| 4,237,601 A | | 12/1980 | Woolhouse et al. | |
| 4,243,969 A | | 1/1981 | Steigerwald et al. | |
| 4,359,915 A | * | 11/1982 | Nascimento | 76/107 |
| 4,445,965 A | | 5/1984 | Milnes | |
| 4,493,855 A | * | 1/1985 | Sachdev | 427/41 |
| 4,502,225 A | | 3/1985 | Lin | |
| 4,517,403 A | | 5/1985 | Morel et al. | |
| 4,551,906 A | * | 11/1985 | Ogura | 29/571 |
| 4,562,091 A | * | 12/1985 | Sachdev | 427/41 |
| 4,568,413 A | * | 2/1986 | Toth | 156/151 |
| 4,599,243 A | * | 7/1986 | Sachdev | 427/38 |
| 4,610,079 A | | 9/1986 | Abe et al. | |
| 4,612,275 A | * | 9/1986 | Gregor | 430/296 |
| 4,638,111 A | | 1/1987 | Gay | |

(List continued on next page.)

FOREIGN PATENT DOCUMENTS

| | | |
|---|---|---|
| EP | 072658 | 2/1983 |
| JP | 10313008 | * 11/1998 |

OTHER PUBLICATIONS

Zhang, C. et al., Blue electroluminescent diodes utilizing blends of poly(p–phenylphenylene vinylene) in poly(9–vinylcarbazole), Synthetic Metals, 1994, 35–40, 62, Elsevier Sequoia.

Nalwa, Hari Singh, Handbook of Organic Conductive Molecules and Polymers, 2–3, Hitachi Research Laboratory, Hitachi Ltd. Ibaraki, Japan.

(List continued on next page.)

*Primary Examiner*—Peter Vo
*Assistant Examiner*—Paul Kim (57) ABSTRACT

This invention pertains to methods of forming a patterned metal layer in an electronic device, wherein the metal layer is in contact with an underlying organic polymeric layer (e.g., a conductive or semiconductive organic polymeric layer), which methods comprise mechanically scribing the metal layer with a mechanical scribing instrument to form the patterned metal electrode. More specifically, this invention pertains to methods of forming a patterned metal layer in an electronic device, which device comprises, in contact sequence, a support layer, an organic polymeric layer, and said metal layer, said method comprising the step of mechanically scribing said metal layer with a mechanical scribing instrument to form said patterned metal layer; wherein said mechanical scribing instrument scribes through the entire thickness of said metal layer; wherein said mechanical scribing instrument scribes through none, some, or all of the thickness of said organic polymeric layer; wherein said mechanical scribing instrument scribes through none or some, but not all, of the thickness of said support layer.

15 Claims, 3 Drawing Sheets

U.S. PATENT DOCUMENTS

| | | | | |
|---|---|---|---|---|
| 4,647,711 A | | 3/1987 | Basol et al. | |
| 4,729,970 A | | 3/1988 | Nath et al. | |
| 4,737,446 A | * | 4/1988 | Cohen | 430/311 |
| 4,745,044 A | * | 5/1988 | Gregor | 430/312 |
| 4,785,191 A | | 11/1988 | Ondris | |
| 4,826,777 A | | 5/1989 | Ondris | |
| 4,835,083 A | * | 5/1989 | Sakai | 430/130 |
| 4,964,959 A | * | 10/1990 | Nelsen | 204/15 |
| 5,023,205 A | * | 6/1991 | Reche | 437/228 |
| 5,055,343 A | * | 10/1991 | Murphy | 728/209 |
| 5,084,400 A | | 1/1992 | Nath et al. | |
| 5,106,537 A | * | 4/1992 | Nelsen | 252/502 |
| 5,196,376 A | * | 3/1993 | Reche | 437/225 |
| 5,276,382 A | | 1/1994 | Stocker et al. | |
| 5,502,002 A | * | 3/1996 | Wong | 437/182 |
| 5,597,767 A | | 1/1997 | Mignardi et al. | |
| 5,622,895 A | * | 4/1997 | Frank | 216/18 |
| 5,679,194 A | * | 10/1997 | Fjelstad | 156/150 |
| 5,766,497 A | * | 6/1998 | Mitwalsky | 216/56 |
| 5,820,006 A | * | 10/1998 | Turner | 225/96 |
| 5,843,363 A | * | 12/1998 | Mitwalsky | 264/400 |
| 5,854,134 A | * | 12/1998 | Lan | 438/695 |
| 5,893,765 A | * | 4/1999 | Farnworth | 439/91 |
| 5,895,581 A | * | 4/1999 | Grunwald | 216/13 |
| 5,974,936 A | * | 11/1999 | Valihura | 83/880 |
| 5,977,860 A | * | 11/1999 | Ulm, Jr. | 337/297 |
| 6,021,574 A | * | 2/2000 | Murray, III | 33/18.1 |
| 6,066,434 A | * | 5/2000 | Blanchet-Fincher | 430/273.1 |
| 6,071,597 A | * | 6/2000 | Yang | 428/209 |
| 6,159,779 A | * | 12/2000 | Huang | 438/158 |

OTHER PUBLICATIONS

Bredas, J. L. et al., Conjugated Polymers, Kluwer Academic Publishers, Dordrecht, The Netherlands.

Greenham, N.C. et al., Efficient light–emitting diodes based on polymers with high electron affinities, Nature, Oct. 14, 1993, 628–630, Vol. 365.

Kanatzidis, Mercouri G., Conductive Polymers, Chemical and Engineering News, Dec. 3, 1990, 36–54.

* cited by examiner

MECHANICAL SCRIBING METHODS OF FORMING A PATTERNED METAL LAYER IN AN ELECTRONIC DEVICE

RELATED APPLICATION

This application claims priority under 35 U.S.C. §119(e) to U.S.S.N. 60/063,427 filed Oct. 28, 1997, the contents of which are hereby incorporated by reference.

TECHNICAL FIELD

This invention pertains generally to the field of fabrication of electronic devices. More particularly, this invention relates to mechanical scribing methods of forming a patterned metal layer which is useful in an electronic device. More specifically, this invention pertains to new methods of forming a patterned metal layer in an electronic device, wherein the metal layer is in contact with an underlying organic polymeric layer (e.g., a conductive or semiconductive organic polymeric layer), which methods comprise mechanically scribing the metal layer with a mechanical scribing instrument to form the patterned metal layer.

BACKGROUND

Throughout this application, various publications, patents, and published patent applications are referred to by an identifying citation; full citations for these documents may be found at the end of the specification immediately preceding the claims. The disclosures of the publications, patents, and published patent specifications referenced in this application are hereby incorporated by reference into the present disclosure to more fully describe the state of the art to which this invention pertains.

With the advent of solid state electronics and the integrated circuit (IC) chip industry, many new methods for the fabrication and processing of solid state electronic devices have been developed. For example, many solid state electronic devices are manufactured by depositing and processing, often sequentially, one or more relatively thin layers of specific materials (e.g., metals, alloys, semiconductors) on a substrate, in order to form a three-dimensional device with the desired electronic function. In many cases, one or more of these layers are "patterned," that is, fabricated or processed to possess a pre-determined shape within the two-dimensional plane of the layer, to provide additional structure to the device.

Many methods for fabricating patterned layers of specific materials have been developed. One common class of patterning methods may be conveniently classified as photolithography methods. In such methods, selected areas of a surface are protected or "masked" (for example, by a shadow mask pressed against the layer, or by a layer of photoresist processed with the aid of a shadow mask), while the unmasked areas are exposed to processes such as the introduction of impurities, deposition of thin films, removal of material by etching, and the like.

For example, it is often possible to form a patterned metal layer by first pressing a "negative" shadow mask against the surface, and subsequently vapor depositing the metal. The metal is deposited only on the open areas within the shadow mask (hence creating a "positive" image) and not on those areas protected by the shadow mask. Following deposition, the shadow mask is withdrawn, yielding the patterned metal layer. In another method, a continuous metal layer is first deposited, and then coated with uncured photoresist (e.g., a polymeric material which is cured, and thus rendered insoluble in certain solvents, by exposure to an appropriate wavelength of light). A "negative" shadow mask is pressed against the photoresist layer, and the assembly exposed to the appropriate light (e.g., ultraviolet light), thereby curing the photoresist in the open areas within the shadow mask. The shadow mask is withdrawn and the uncured photoresist removed, often using wet chemical methods (e.g., by washing with an appropriate solvent), to expose areas of metal. The exposed metal is then removed, for example, using wet chemical etching methods, and finally the cured photoresist is removed to yield the desired patterned metal layer (with a "positive" image pattern).

Screen printing methods have also been employed in the fabrication of patterned metal layers, typically with the aid of an (often electrically conducting) ink or paste which comprises metal particles. Screen printing methods, which may conveniently be considered refined stenciling methods, typically employ a stencil (akin to the photolithography mask) in combination with a screen (a woven fabric, generally of polyester, nylon, or stainless steel). During printing, a squeegee presses the ink or paste through the screen; where the stencil permits, the ink or paste is applied to the surface to be patterned. The stencil and screen are then removed to yield the printed pattern. Following screen printing with metallic inks and pastes, the layer is often heated, dried, and/or cured.

Recently, laser methods, such as laser scribing, laser ablation, and laser etching, have been used in the fabrication of patterned layers. Typically, in these methods, an intense focused laser beam is rastered across the surface, causing the illuminated material to be vaporized, sputtered, or otherwise removed, leaving a groove, trench, via, trough, or other indentation with a shape determined by the path of the laser beam, and a depth determined by the intensity and raster speed of the laser beam.

Many of these methods are particularly well adapted for the specific materials. For example, for metals which can be easily vapor deposited, photolithography methods employing a negative shadow mask are often very useful. For more refractory materials, such as oxides, nitrides, and many inorganic semiconductor materials, laser ablation methods may be better suited. Whichever method is employed, an important factor for assessing that method's usefulness is the quality of the resulting pattern, determined, for example, by the sharpness of the edges of the pattern and the amount and size of any residual debris.

Many electronic devices comprise a metal layer, often in the form of a relatively thin layer of metal material. Such metal layers, which often function as an electrode for the electronic device, are often patterned. For example, many common electronic devices require a thin patterned layer of conducting metal over an insulating or semiconducting substrate, with a pattern comprising a large number of very narrow electrically isolated bars (e.g., stripes) of metal, each separated by a very narrow gap. In such cases, a particularly useful patterning method would be one which offers both very sharp pattern edges (facilitating narrow metal bars, narrow gaps, and thus a large number of bars per unit distance perpendicular to the bar (i.e., high resolution) with a large "fill factor" (i.e., ratio of active to non-active area)) and residual debris which is small compared to the dimensions of the gap (so that the debris is unlikely to bridge the gap and cause an inadvertent electrical short).

The present invention pertains to new methods of forming a patterned metal layer (which comprise mechanically scribing the metal layer with a mechanical scribing instrument to form the patterned metal layer) and which address many or all of these requirements.

Mechanical scribing methods are well known to those of skill in the art. However, the primary use of mechanical scribing in the manufacture of electronic devices has been to effect separation (e.g., of dice from a larger wafer). Typically, a wafer is first mechanically scribed or scored and subsequently fractured or cleaved along the scribe or score line. Such methods are widely used to effect the separation of partially or completely finished individual electronic devices (e.g., dice) from a larger wafer. For example, large numbers of electronic devices are often fabricated simultaneously on a single wafer; when the fabrication is partially or fully complete, the wafer is scribed or scored (often using mechanical scribing methods), and individual devices are cleaved off.

Methods of separating individual dice from a larger wafer which employ, as a first, step, mechanical scribing to form a scribe line for cleaving have apparently been disclosed (see, for example, Nath et al., 1992, at column 13, where a scribe line through a metallic top layer and partially through an underlying semiconductor layer is described). Methods of cleaving semiconductor diode lasers from a larger wafer which employ a diamond circular saw blade to cut a groove through layers of metal and into a gallium arsenide substrate have apparently been disclosed (see, for example, Woolhouse et al., 1980, at column 4). Methods of dividing metal plated semiconductor wafers, which include the step of mechanically scribing through a metal layer and a photoresist layer and partially into the underlying semiconductor, have apparently been disclosed (see, for example, Fair et al., 1977).

Mechanical scribing methods have also apparently been employed in the formation of patterned layers of certain classes of materials, for example, oxides, such as indium tin oxide (ITO), and semiconductor substrates. Methods of making photoresponsive arrays have been disclosed which apparently may employ mechanical scribing methods to pattern inorganic semiconductor layers (see, for example, Ondris, 1988 and Ondris, 1989, both at column 10). Methods of making thin film solar cells which apparently employ mechanical scribing methods to pattern layers of copper indium diselenide and zinc oxide have also been disclosed (see, for example, Gay, 1987, at column 12). Methods of patterning indium tin oxide (ITO) layers, including mechanical scribing methods, have apparently been disclosed (see, for example, Stocker et al., 1994, at column 5). Methods of patterning optically transparent electrically conductive layers, such as ITO, indium oxide, zinc oxide, and tin oxide, on transparent substrates for use in photovoltaic devices, including mechanical scribing methods, have apparently been disclosed (see, for example, Basol et al., 1987, at column 5). Methods of fabricating solar cells, which apparently include patterning a back metal electrode using screen printing or mechanical scribing methods have apparently been disclosed (see, for example, Morel et al., 1985, at column 7). Methods of fabricating liquid crystal display devices, which include a method of patterning a transparent electrically conductive layer on a substrate have apparently been disclosed (see, for example, Crossland et al., 1983). Methods of fabricating solar cells, which include a method of patterning a tellurium layer on a cadmium telluride substrate which may employ mechanical scribing, have apparently been disclosed (see, for example, Milnes, 1984).

Although mechanical scribing methods have been used in the manufacture of electronic devices, as described above, mechanical scribing methods have never been employed in the patterning of a metal layer in contact with an underlying organic polymeric layer (e.g., a conductive or semiconductive organic polymeric layer). The disinterest in mechanical scribing as a method for patterning metal layers may be attributed to poor results previously obtained (e.g., rough pattern edges, large fragments of debris) and to the availability of other apparently successful, albeit relatively complex and expensive, methods (e.g., photolithography).

The inventor has discovered the surprising and unexpected result that a metal layer in contact sequence with an underlying organic polymeric layer, may be successfully and usefully patterned using mechanical scribing methods. By comparison, when an organic polymeric layer, without a metallic overlayer, is mechanically scribed, extremely poor results are obtained: the scribe line has very poorly defined and irregular edges, and copious amounts of large debris particles. In contrast, when an organic polymeric layer/ metallic overlayer structure is mechanically scribed, desirable results are obtained: the scribe line has well defined and regular edges, and dimensionally small debris as compared with the dimensions of the scribe line. Without wishing to be bound by any particular theory, the inventor postulates that the metal overlayer provides a protecting layer in which the scribe cut is cleanly initiated, and that underlying polymer layer may act as a sort of "cutting mat," thereby facilitating the sharp and clean scribing of the metal overlayer.

Thus, the present invention pertains to new methods of forming a patterned metal layer in an electronic device, wherein the metal layer is in contact with an underlying organic polymeric layer (e.g., a conductive or serniconductive organic polymeric layer), which methods comprise mechanically scribe layer with a mechanical scribing instrument to from the patterned metal layer. In comparison with commonly employed patterning methods (e.g., photolithography, laser ablation), the mechanical scribing methods of the present invention are procedurally simpler, faster and often cheaper.

SUMMARY OF THE INVENTION

One aspect of the present invention pertans to methods of forming a patterned metal layer in an electronic device, wherein the metal layer is in contact with an underlying organic polymeric layer (e.g., a conductive or semiconductive organic polymeric layer), which methods comprise mechanically scribing the metal layer with a mechanical scribing instrument to form the patterned metal layer.

In one embodiments the present invention pertains to a method of forming a patterned metal layer in an electronic device, which device comprises, in contact sequence, a support layer, an organic polymeric layer, and said metal layer, said method comprising the step of mechanically scribing said metal layer with a mechanical scribing instrument to form said patterned metal layer; wherein said mechanical scribing instrument scribes through the entire thickness of said metal layer; wherein said mechanical scribing instrument scribes through none, some, or all of the thickness of said organic polymeric layer; wherein said mechanical scribing instrument scribes through none or some, but not all, of the thickness of said support layer.

In one embodiment, the present invention pertains to a method of forming a patterned metal electrode layer in an electronic device, which device comprises, in contact sequence, a substrate layer, a first electrode layer, an organic polymeric layer, and said metal electrode layer, said method comprising the step of mechanically scribing said metal electrode layer with a mechanical scribing instrument to form said patterned metal electrode layer; wherein said mechanical scribing instrument scribes through the entire thickness of said metal electrode layer; wherein said mechanical scribing instrument scribes through none, some, or all of the thickness of said organic polymeric layer; wherein said mechanical scribing instrument scribes through none or some, but not all, of the thickness of said first electrode layer; and, wherein said mechanical scribing instrument scribes through none or some, but not all, of the thickness of said substrate layer.

In one embodiment, the present invention pertains to a method of forming a patterned metal cathode layer in an electronic device, which device comprises, in contact sequence, a substrate layer, an anode layer, an organic polymeric layer, and said metal cathode layer, said method comprising the step of mechanically scribing said metal cathode layer with a mechanical scribing instrument to form said patterned metal cathode layer; wherein said mechanical scribing instrument scribes through the entire thickness of said metal cathode layer; wherein said mechanical scribing instrument scribes through none, some, or all of the thickness of said organic polymeric layer; wherein said mechanical scribing instrument scribes through none or some, but not all, of the thickness of said anode layer; and, wherein said mechanical scribing instrument scribes through none or some, but not all, of the thickness of said substrate layer.

In one embodiment, the present invention pertains to a method of forming a patterned electron-injecting metal cathode layer in a light emitting diode, which light emitting diode comprises, in contact sequence, a transparent substrate layer, a transparent hole-injecting anode layer, an emissive organic polymeric layer comprising an electroluminescent polymer, and said metal cathode layer, said method comprising the step of mechanically scribing said metal cathode layer with a mechanical scribing instrument to form said patterned metal cathode layer; wherein said mechanical scribing instrument scribes through the entire thickness of said metal cathode layer; wherein said mechanical scribing instrument scribes through none, some, or all of the thickness of said emissive organic polymeric layer; wherein said mechanical scribing instrument scribes through none or some, but not all, of the thickness of said anode layer; and, wherein said mechanical scribing instrument scribes through none or some, but not all, of the thickness of said substrate layer.

In one embodiment, the mechanical scribing instrument is metallic. In one embodiment, the mechanical scribing instrument is stainless steel. In one embodiment, the mechanical scribing instrument is a stainless steel stylus, a diamond stylus, or a soda lime glass stylus.

In one embodiment, the patterned metal layer comprises one or more bars, stripes, lines, rows, or columns. In one embodiment, the patterned metal layer comprises two or more bars, stripes, lines, rows, or columns. In one embodiment, the patterned metal layer comprises three or more bars, stripes, lines, rows, or columns. In one embodiment, the patterned metal layer comprises ten or more bars, stripes, lines, rows, or columns. In one embodiment, the patterned metal layer comprises one hundred or more bars, stripes, lines, rows, or columns.

In one embodiment, the mechanical scribing instrument passes through at least about 50% of said organic polymeric layer.

In one embodiment, the organic polymeric layer comprises a conductive or semiconductive polymer. In one embodiment, the organic polymeric layer comprises a polymer which is conjugated or which comprises segments of conjugated moieties. In one embodiment, the organic polymeric layer comprises a polymer selected from the group consisting of: polyanilines, polythiophenes, polyquinolines, polyarylenes, polyphenylenes, polyarylenevinylenes, polyphenylenevinylenes, polyacetylenes, polyfurans, and polypyrroles. In one embodiment, the organic polymeric layer comprises a polyphenylenevinylene polymer.

In one embodiment, the electroluminescent polymer is selected from the group consisting of: poly(p-phenylene vinylene)s, poly(arylene vinylene)s, poly(p-phenylene)s, poly(arylene)s, and polyquinolines. In one embodiment, the electroluminescent polymer is a polyphenylenevinylene polymer.

In one embodiment, the organic polymeric layer has a thickness of about 200 Å to about 2 $\mu$m.

In one embodiment, the metal layer comprises one or more metals selected from the group consisting of: lithium, sodium, potassium, rubidium, cesium, magnesium, calcium, strontium, barium, chromium, nickel, platinum, copper, silver, gold, aluminum, tin, lanthanide metals, actinide metals. In one embodiment, the metal layer comprises one or more metals selected from the group consisting of: aluminum, copper, chromium, and gold. In one embodiment, the metal layer comprises a first metal selected from the group consisting of: calcium, barium, and ytterbium; and a second metal selected from the group consisting of: aluminum, copper, chromium, and gold.

In one embodiment, the metal layer has a thickness of about 100 Å to about 5 $\mu$m.

In one embodiment, the first electrode layer or the anode layer comprises one or more materials selected from the group consisting of: metal, metal oxide, graphite, doped inorganic semiconductor, and doped conjugated polymer. In one embodiment, the first electrode layer or the anode layer comprises one or more materials selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

In one embodiment, the substrate comprises glass. In one embodiment, the substrate comprises soda lime glass.

Another aspect of the present invention pertains to an electronic device comprising a patterned metal layer which is in contact with an underlying organic polymeric layer (e.g., a conductive or semiconductive organic polymeric layer), and which patterned metal layer was formed by a method of the present invention.

As will be appreciated by one of skill in the art, features of one aspect or embodiment of the invention are also applicable to other aspects or embodiments of the invention.

DETAILED DESCRIPTION OF THE INVENTION

The present invention pertains to new methods of forming a patterned metal layer (i e., methods of forming a pattern in a metal layer) in an electronic device, wherein the metal layer is in contact with an underlying organic polymeric layer (e.g., a conductive or semiconductive organic polymeric layer), which methods comprise mechanically scribing the metal layer with a mechanical scribing instrument to form the patterned metal layer.

One aspect of the present invention pertains to methods of forming a patterned metal layer in an electronic device, which device comprises, in contact sequence, a support layer, an organic polymeric layer, and said metal layer, said method comprising the step of mechanically scribing said metal layer with a mechanical scribing instrument to form said patterned metal layer; wherein said mechanical scribing instrument scribes through the entire thickness of said metal layer; wherein said mechanical scribing instrument scribes through none, some, or all of the thickness of said organic polymeric layer; wherein said mechanical scribing instrument scribes through none or some, but not all, of the thickness of said support layer.

The term "electronic device" is used herein in the conventional sense and relates to devices which perform specific and desired electronic functions, and which are useful in electronic circuits. Examples of electronic devices include diodes, such as light emitting diodes (LEDs), triodes, photovoltaic cells, such as solar cells, capacitors, resistors, inductors, and transistors, such as field effect transistors (FETs).

Many electronic devices comprise a metal layer, sheet, or film. Such layers are typically planar or approximately planar, though other shapes are possible. In some electronic devices, the metal layer is unpatterned; that is, viewed from above the plane, the layer is continuous. However, in many other cases, the metal layer is patterned; that is, viewed from above the plane, the layer is discontinuous. In those cases where the layer is patterned, the layer may be a single, electrically continuous layer, or it may be subdivided to form two or more physically separated and/or electrically isolated regions within the two-dimensional plane of the layer. The latter is particularly common in electronic devices which employ indexing or addressing, including, for example, display devices such as light emitting diode (LED) displays and liquid crystal (LCD) displays.

The term "patterned metal layer," as used herein, pertains to a metal layer which is suitable for use in electronic devices and which has been formed, shaped, cut, divided, or otherwise processed so as to possess a predetermined desirable two-dimensional pattern within the two-dimensional plane of the metal layer. Examples of such patterns include, but are not limited to, one or more bars, stripes, lines, rows, columns, squares, rectangles, triangles, and other geometric shapes, and combinations thereof, which may form a repeating or a non-repeating pattern.

The metal layer (and thus also the patterned metal layer), which may itself be comprised of one or more layers, is comprised of metal material and is in contact with the underlying organic polymeric layer. In many embodiments, the metal layer is the final, exposed, outermost, or surface layer. The term "metal material" is used herein in the conventional sense, and relates to materials which exhibit metallic properties (e.g., high electrical conductivity). Examples of metal materials include pure metallic elements and metallic alloys. Examples of pure metallic elements include, but are not limited to, alkali metals such as lithium (Li), sodium (Na), potassium (K), rubidium (Rb), and cesium (Cs); alkaline earth metals such as magnesium (Mg), calcium (Ca), strontium (Sr), and barium (Ba); transition metals such as chromium (Cr), nickel (Ni), platinum (Pt), copper (Cu), silver (Ag), gold (Au); Group III to Group VIa metals such as aluminum (Al) and tin (Sn); and lanthanide and actinide metals. Examples of metallic alloys include, but are not limited to, alloys comprising one or more metals, such as magnesium-silver (Mg—Ag) alloys. In one embodiment, the metal layer comprises a metal selected from the group consisting of: aluminum, copper, chromium, and gold. In one embodiment, the metal layer comprises a first metal selected from the group consisting of: calcium, barium, and ytterbium; and a second metal selected from the group consisting of: aluminum, copper, chromium, and gold.

The metal layer is typically relatively thin. In some embodiments, the metal layer has a thickness of about 100 Å to about 5 $\mu$m. In some embodiments, the metal layer has a thickness of about 500 Å to about 3 $\mu$m. In some embodiments, the metal layer has a thickness of about 0.1 $\mu$m to about 3 $\mu$m. In some embodiments, the metal layer has a thickness of about 0.5 $\mu$m to about 2.5 $\mu$m.

The term "organic polymeric layer," as used herein, relates to a layer which comprises an organic polymeric material, and which is bounded on one of its major sides or faces by the metal layer. In many embodiments, the organic polymeric layer underlies the final, exposed, outermost, or surface metal layer. In many embodiments, the organic polymeric layer is also bounded on the major side or face opposite the metal layer by a support layer.

The term "organic polymeric material," as used herein, relates to a material which comprises both carbon (C) and hydrogen (H), and which has a polymeric structure (i.e., two or more linked repeating subunits). Examples of organic polymeric materials include, but are not limited to, linear polymers, branched polymers (including star and comb polymers), and network polymers (including ladder, semiladder, stepladder polymers), including, but not limited to, homopolymers, copolymers (such as alternating, random, block, and graft copolymers), and mixtures thereof.

In some embodiments, the organic polymeric layer has a thickness of about 200 Å to about 2 $\mu$m. In some embodiments, the organic polymeric layer has a thickness of about 500 Å to about 1 $\mu$m. In some embodiments, the organic polymeric layer has a thickness of about 500 Å to about 0.5 $\mu$m. In some embodiments, the organic polymeric layer has a thickness of about 500 Å to about 0.2 $\mu$m. Typically, the organic polymeric layer is relatively soft and flexible, as compared with relatively hard and rigid inorganic semiconductors.

In many embodiments, the organic polymeric material is also electrically conductive or electrically semiconductive (e.g., the organic polymeric material is not electrically insulating). Although most polymers are good insulators, a wide range of conductive and semiconductive polymers have been developed in recent years. See, for example, Nalwa, 1997, and Kanatzidis, 1990. Many polymers which are conjugated or which comprise segments of π-conjugated moieties form the basis for conductive and semiconductive materials. Examples of such polymers include polyanilines, polythiophenes, polyquinolines, polyarylenes, polyphenylenes, polyarylenevinylenes, polyphenylenevinylenes, polyacetylenes, polyfurans, polypyrroles. Polymers may be rendered conductive and semiconductive by doping, either by processing (e.g., oxidation) of the polymer to form dopants in situ, or by the addition of dopants. Examples of such polymers include partially oxidized polyacetylene, $AsF_5$ doped polyphenylenes, iodine or $AsF_5$ doped polyacetylenes, doped polyethylene oxides, $ClO_4^-$ doped polyfurans or polypyrroles, $BF_4^-$ doped polyazulenes or polythiophenes, and $H^+$ doped polyaniline.

The term "support layer," as used herein, relates to a layer which is in contact with the organic polymeric layer, on the major side or face opposite to the metal layer. In this way, the organic polymeric layer may conveniently be considered to be sandwiched between the support layer and the metal layer. The support layer may itself comprise one or more layers, which may or may not themselves be patterned layers. Thus, the support layer may comprise one or more layers which may conveniently be identified as substrate layers, oxide layers, electrode layers, passivation layers, charge transport layers, and the like.

The present invention pertains to methods of forming a patterned metal layer which employ mechanical scribing. The term "scribing" is used herein in the conventional sense, and relates to the physical marking or scoring of a surface of an object. The term "mechanical scribing" is also used herein in the conventional sense, and relates to the physical marking or scoring of a surface of an object by physically contacting the surface with a mechanical scribing instrument. Typically, a surface is mechanically scribed by drawing a mechanical scribing instrument along or across the surface. In this way, a groove, trench, via, trough, or other indentation with a shape determined by the shape of the mechanical scribing instrument and its path, and a depth determined by the nature of the mechanical scribing instrument and the scribing parameters employed. Typically, the mechanical scribing instrument comprises a sharp point or edge, as may be provided, for example, by a stylus, pin, blade, chisel, or knife, and is formed from a material with a hardness which is greater than that of the surface to be scribed.

In the methods of the present invention, a patterned metal layer is formed by mechanically scribing the metal layer with a mechanical scribing instrument. More specifically, the metal layer is scribed in such a manner that the mechanical scribing instrument scribes through the entire thickness of the metal layer, scribes through none, some, or all of the thickness of the organic polymeric layer, and scribes through none or some, but not all, of the thickness of the support layer. In one embodiment, the mechanical scribing instrument scribes through less than 10% of the thickness of the organic polymeric layer. In one embodiment, the mechanical scribing instrument scribes through more than 20% of the thickness of the organic polymeric layer. In one embodiment, the mechanical scribing instrument scribes through more than 50% of the thickness of the organic polymeric layer. In one embodiment, the mechanical scribing instrument scribes through more than 90% of the thickness of the organic polymeric layer.

While the mechanical scribing instrument fully penetrates and passes through the entire thickness of the metal layer, and while it may partially or fully penetrate and pass through the thickness of the organic polymeric layer, it does not fully penetrate or pass through the support layer. This result, wherein the metal layer is patterned while the support layer is not substantially altered or damaged, is a consequence of the nature of the mechanical scribing instrument and the scribing parameters employed. Typically, the support layer is considered to be undamaged so long as its electrical properties (i.e., electrical continuity, electrical isolation) are maintained. The desired scribing through some materials (e.g., metal layer) and not through others (e.g., support layer), may be achieved by selecting a mechanical scribing instrument with a suitable hardness, and by employing suitable scribing parameters.

To obtain the desired result, the hardness of the mechanical scribing instrument must be greater than the hardness of the metal layer. Typically, the hardness of the mechanical scribing instrument is also greater than the hardness of the organic polymeric layer. In some embodiments, the hardness of the mechanical scribing instrument is less than the hardness of the support layer; that is, less than the hardness of that portion of the support layer which underlies the organic polymeric layer. The absolute hardnesses of the mechanical scribing instrument, the metal layer, the organic polymeric layer, and the support layer are not particularly important. Instead, it is their relative hardnesses and the scribing parameters employed which will primarily determine the desired penetration through some layers and not through others.

Although the absolute hardnesses need not be determined, such information may provide useful guidance in the selection of an appropriate mechanical scribing instrument. Two common measures of hardness are "Mohs' scale" and "Knoops' scale." Mohs' scale is a hardness scale in which a series of ten minerals are arranged in order, each mineral listed being scratched by, and therefore softer than, those below it. Thus, diamond has a hardness of 10 Mohs and graphite has a hardness of 1 Moh. On Knoops' scale, diamond has a hardness of about 7000 Knoop and graphite has hardness of less than about 30 Knoop. Examples of materials which may be suitable for mechanical scribing instruments include, but are not limited to, relatively hard metals and alloys, such as stainless steel, hard minerals, such as diamond, ceramics such as marble, mica, and glass, and other refractory materials such as refractory oxides and nitrides. In one embodiment, the mechanical scribing instrument is metallic, for example, stainless steel. In one embodiment, the mechanical scribing instrument is a stainless steel stylus, a diamond stylus, or a soda lime glass stylus.

Scribing parameters for mechanical scribing methods, and their adjustment, are known to those of skill in the art, and include parameters such as the pressure or force applied to the mechanical scribing instrument, the scribing speed, and the orientation of the mechanical scribing instrument with respect to the surface begin scribed. Many scribing parameters, including these, are often determined and optimized empirically. Typical scribing forces are from about 10 $kg/cm^2$ to about 10,000 $kg/cm^2$. Typical scribing speeds are from about 0.1 cm/s to about 75 cm/s. Typically, the scribing angle is greater than about 30° and less than about 150°.

For convenience, the scribing angle is defined herein to be the angle formed between two lines, one defined by the mechanical scribing instrument, and one defined by the scribed line. The latter is a line which is both tangential to the surface and tangential to the scribed line at the point where the mechanical scribing instrument meets the surface, and is drawn from that point in the direction of the already scribed line (i.e., backward). For example, where the surface is planar and the scribe line in linear, the scribing angle is greater than 0° and less than 90° when the mechanical scribing instrument is angled backward (i.e., over the already scribed line), and is greater than 90° and less than 180° when the mechanical scribing instrument is angled forward (i.e., over where the scribe line will be, but is not yet formed). The scribe angle is 90° when the mechanical scribing instrument is normal to the surface.

Using the methods of the present invention, scribe lines with a width of about 30 $\mu$m to 40 $\mu$m, and with edge defects and residual debris with dimensions up to about 3 $\mu$m may readily be obtained. In many applications, it is desirable to pattern a metal layer to form bars, stripes, lines, rows, or columns with very high line densities. Using the methods of the present invention, line densities of as high as about 100 to 150 lines per inch (or about 170 $\mu$m to about 250 $\mu$m per line, which includes the width of the stripe and the width of the gap between it and the adjacent stripe) may readily be obtained. In this way, conventional display devices, such as LEDs and LCDs, can readily be fabricated with indexed pixels with dimensions of about 300 $\mu$m to 400 $\mu$m on a side.

Mechanical scribing methods are well known to those of skill in the art, as discussed above. Consequently, mechanical scribing apparati are also well known in the art of electronic device fabrication. See, for example, Lin, 1985. Such scribing apparati generally employ an automated mechanism, such as a motor driven stylus, in conjunction with a computer hardware and software, to draw the mechanical scribing instrument across the surface to be scribed in a controlled fashion. For example, an apparatus typically used to scribe and cut glass for use as substrates in the manufacture of liquid crystal displays (LCDs), and which is suitable for use in the methods of the present invention, is commercially available (Villa Precision Inc., Phoenix, Ariz.).

In one embodiment of the present invention, the methods of forming patterned electrodes is employed in the fabrication of one class of electronic devices, specifically, those which comprise, in contact sequence, a substrate, a first electrode layer (which together may conveniently be regarded as a support layer), an organic polymeric layer, and a metal electrode layer. Note, however, that one of ordinary skill in the art will readily recognize that the methods described herein are also applicable and useful in the fabrication of other classes of electronic devices.

Thus, one embodiment of the present invention pertains to a method of forming a patterned metal electrode layer in an electronic device, which device comprises, in contact sequence, a substrate layer, a first electrode layer, an organic polymeric layer, and said metal electrode layer, said method comprising the step of mechanically scribing said metal electrode layer with a mechanical scribing instrument to form said patterned metal electrode layer; wherein said mechanical scribing instrument scribes through the entire thickness of said metal electrode layer; wherein said mechanical scribing instrument scribes through none, some, or all of the thickness of said organic polymeric layer; wherein said mechanical scribing instrument scribes through none or some, but not all, of the thickness of said first electrode layer; and, wherein said mechanical scribing instrument scribes through none or some, but not all, of the thickness of said substrate layer.

The metal electrode layer may conveniently be regarded as the metal layer, described above. The metal electrode layer, together with the first electrode layer, facilitates the application of an electrical potential across (or an electrical current through) the organic polymeric layer. In some embodiments, the metal electrode layer functions as an anode (a hole-injecting material). In some embodiments, the metal electrode layer functions as a cathode (an electron-injecting material).

The first electrode layer and the substrate layer, taken together, may conveniently be regarded as the support layer, described above. The first electrode layer is in contact both with the substrate layer and the organic polymeric layer. The first electrode, together with the metal electrode layer, facilitates the application of an electrical potential across (or an electrical current through) the organic polymeric layer. In some embodiments, the first electrode layer functions as a cathode (an electron-injecting material). In some embodiments, the first electrode layer functions as an anode (a hole-injecting material). In some embodiments, the first electrode layer itself further comprises optional layers (e.g., electrontransport layers, hole-transport layers).

A substrate layer is often employed for its physical, electrical, and/or chemical properties, and it often contributes to the physical strength of the device, the ease of fabrication and processing of the device, and/or the desired or intended operation of the device. A wide variety of materials have been employed as substrates in electronic devices, including, but not limited to, electrical insulators (e.g., soda lime glass, alumina, polycarbonates), electrical conductors (e.g., metals such as copper, aluminum), and electrical semiconductors (e.g., gallium arsenide).

In one embodiment of the present invention, the methods of forming patterned electrodes are employed in the fabrication of one class of electronic devices, specifically, polymer light emitting diodes (LEDs). Note, however, that one of ordinary skill in the art will readily recognize that the methods described herein are also applicable and useful in the fabrication of other classes of electronic devices.

Thus, one embodiment of the present invention pertains to a method of forming a patterned electron-injecting metal cathode layer in a light emitting diode, which light emitting diode comprises, in contact sequence, a transparent substrate layer, a transparent hole-injecting anode layer, an emissive organic polymeric layer comprising an electroluminescent polymer, and said metal cathode layer, said method comprising the step of mechanically scribing said metal cathode layer with a mechanical scribing instrument to form said patterned metal cathode layer; wherein said mechanical scribing instrument scribes through the entire thickness of said metal cathode layer; wherein said mechanical scribing instrument scribes through none, some, or all of the thickness of said emissive organic polymeric layer; wherein said mechanical scribing instrument scribes through none or some, but not all, of the thickness of said anode layer; and, wherein said mechanical scribing instrument scribes through none or some, but not all, of the thickness of said substrate layer.

A typical polymer LED comprises an emissive organic polymeric layer comprising an electroluminescent polymer sandwiched between a cathode layer (comprising a low work function material and optionally a capping layer) and an anode layer. In many cases, a substrate layer is also employed, and the anode layer (or the cathode layer) is also in contact with this substrate layer. Other layers known in the art to enhance the performance may also be incorporated, if desired, including, for example, electron transport layers and/or hole transport layers (see, for example, Greenham et al., 1993; and Zhang et al., 1993).

For example, a common display device employs a rectangular planar light emitting diode (LED) device. The anode layer is a patterned anode layer: instead of being a single continuous layer, it has been processed to form electrically isolated bars or stripes parallel to one edge of the rectangular LED. Similarly, the cathode layer is a patterned cathode layer: it too has been processed to form electrically isolated bars or stripes, parallel to one edge of the rectangular LED, but perpendicular to the anode bars. When viewed from above the plane, a two-dimensional grid is defined by the perpendicular anode and cathode bars. Each cell of the grid (often referred to as a "pixel") is "addressed" or "indexed" by its anode and cathode bars, and may be illuminated by applying the suitable potential between its anode bar and cathode bar.

In typical polymer LEDs, the emissive polymeric layer (often referred to as the luminescent polymeric layer) comprises an electroluminescent polymer (often referred to as a luminescent and/or emissive polymer) and optionally one or more additives. In many embodiments, the emissive polymeric layer comprises at least one conductive or semiconductive polymer. In many embodiments, this conductive or semiconductive polymer is a conjugated polymer or a co-polymer which contains segments of π-conjugated moieties. Examples of such polymers are well known in the art (see, for example, Bredas et al., 1991), and include, but are not limited to:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers;

(ix) poly(p-phenylene) and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, fuirylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility;

(xiv) rigid rod polymers such as poly(p-phenylene-2,6-benzobisthiazole), poly(p-phenylene-2,6-benzobisoxazole), poly(p-phenylene-2,6-benzimidazole), and their derivatives;

and the like. In one embodiment, the electroluminescent polymer is a polyphenylenevinylene polymer. In one embodiment, the electroluminescent polymer is poly (5-(2'-ethylhexyloxy)-2-methoxy-1,4-phenylene vinylene). In one embodiment, the electroluminescent polymer is poly(2-methoxy-5-(3,7-dimethyloctyloxy) phenylvinylene) (often referred to as $OC_1C_{10}$-PPV).

The emissive organic polymeric layer can typically be fabricated using any of the techniques known in the art, particularly those methods known in the art of polymer LEDs, including, for example, casting directly from solution, and casting of a polymer precursor followed by reaction (e.g., by heating) to form the desired polymer in situ. Typically, the emissive polymeric layer has a thickness of about 200 Å to about 2 μm, more preferably about 700 Å to about 1500 Å, still more preferably about 1000 Å. The emissive organic polymeric layer of a polymer LED is typically bounded on one major face or side by an anode layer and on the opposite major face or side by a cathode layer.

In typical polymer LEDs, the anode layer is a transparent conductive layer which serves as a hole-injecting layer and which comprises a material with work function above about 4.5 eV. Typical anode materials include metals (such as aluminum, Al, silver, Ag, platinum, Pt, gold, Au, palladium, Pd, tungsten, W, indium, In, copper, Cu, iron, Fe, nickel, Ni, zinc, Zn, lead, Pb, and the like); metal oxides (such as lead oxide, tin oxide, indium/tin-oxide, and the like); graphite; doped inorganic semiconductors (such as silicon, germanium, gallium arsenide, and the like); and doped conducting polymers (such as polyaniline, polypyrrole, polythiophene, and the like). When metals such as those listed above are used, the anode layer must be sufficiently thin to be semi-transparent to the light emitted in the emissive layer. Metal oxides such as indium/tin-oxide and conducting polymers such as polyaniline and polypyrrole are typically semi-transparent in the visible portion of the spectrum.

The anode layer can typically be fabricated using any of the techniques known in the art for deposition of thin films, for example, by vacuum thermal evaporation, by sputtering, by electron beam deposition, by chemical vapor deposition, using for example, pure metals or alloys or other film precursors, or by solution methods, such as casting. Typically, the anode layer has a thickness of about 300 Å to about 3000 Å.

In some embodiments, the anode layer further comprises one or more optional layers, such as charge transport layers (e.g., electron-transport layers, hole-transport layers). In some embodiments, the anode layer comprises an optional hole-transport layer (e.g., a polyaniline layer) which is in contact with the emissive organic polymeric layer.

Although not strictly required, typical polymer LEDs also employ a substrate. A number of suitable substrate materials are well known in the art, and include, for example, soda lime glass. Typically, the substrate is essentially transparent to the emitted light and has a thickness of about 0.2 to about 2 mm, and often about 1 mm. Currently, an ITO coated glass product, which combines both substrate and first electrode (e.g., anode) layer, is commercially available (e.g., from Applied Films Corporation, Boulder, Colorado) having a glass thickness of 1.1 mm, an ITO thickness of 0.14 μm, and a sheet resistance of about 10–15 Ω/□. (Note that Ω/□ are units of "ohms per square," where the □ has units of area, specifically, $mil^2$ where 1 mil equals 0.001 inch or 25.4 μm.)

In many typical polymer LEDs, the anode layer is also patterned. For example, indium tin oxide (ITO) layers, such as those found in the commercially available ITO/glass materials, may be patterned using conventional photolithography methods. For example, where the ITO anode layer is patterned to form lines, rows, or stripes, line densities of as high as about 500 to 600 lines per inch (or about 42 $\mu$m to about 50 $\mu$m per line, which includes the width of the stripe and the width of the gap between it and the adjacent stripe) may readily be obtained.

In typical polymer LEDs, the emissive polymeric layer is bounded by a cathode layer on the surface opposite the anode layer. The cathode layer serves as an electron-injecting layer and typically comprises a metal or alloy having a low work function, typically below about 4 eV, and often below about 3 eV. Examples of such materials include alkaline earth metals, such as magnesium (Mg, ~3.66 eV), calcium (Ca, ~2.7 eV), strontium (Sr, ~2.76 V), barium (Ba, ~2.35 eV), ytterbium (Yb, ~2.60 eV), and magnesium-silver alloys (Mg—Ag, ~3.66 eV, based on the value for the lower material, Mg). See, for example, Sze, 1981.

Typically, the cathode layer comprises a first layer (in contact with the emissive polymeric layer) which comprises a low work function metal or alloy, as described above, and a second capping or passivating layer. Materials suitable for use as the second capping or passivating layer are typically those which can be applied using evaporation methods, and which only slowly oxidize in an ambient environment. Examples of such materials include, but are not limited to, aluminum (Al), copper (Cu), chromium (Cr), and gold (Au).

Both layers of the cathode layer may typically be fabricated using any of the techniques known in the art for deposition of thin metallic films, for example, by vacuum thermal evaporation, by sputtering, or by electron beam deposition, using for example, pure metals or alloys. The entire cathode layer (first and second layers together) typically has a thickness of about 100 Å to about 5 $\mu$m. In one embodiment, the first layer has a thickness of about 15 Å to about 5000 Å, and the second layer has a thickness of about 1 to 2 $\mu$m.

The metal cathode layer may be patterned according to the methods of the present invention. In this way, LEDs may be prepared which are particularly useful in display applications.

EXAMPLES

Several methods of the present invention are illustrated in the Examples below, which are offered by way of illustration and not by way of limitation.

Example 1

All steps were carried out in a clean room (class 1000 or cleaner). A glass substrate (3 cm×3 cm) having a thickness 1.1 mm and coated with a 0.14 $\mu$m sputtered layer of indium tin oxide (ITO) and having sheet resistance of 10–15 $\Omega/\square$ was obtained from a commercial source (Applied Films Corporation, Boulder, Colo.). A square portion (7 mm×7 mm) of the ITO layer was patterned using conventional and established photolithography techniques to yield a patterned ITO anode layer. The patterned ITO/glass substrate assembly was then plasma cleaned (using a Model LF-5 Plasma System, from Mercator Control Systems Inc., at a power setting of 300 W with an oxygen pressure of approximately 0.3 Torr). The assembly was subsequently spin-coated (4000 RPM, 1 minute) with an aqueous 1% by weight solution of polyaniline (average molecular weight of approximately 100,000), and dried in air for 45 minutes on a hot plate at 50° C. followed by drying in a vacuum oven for 12 hours at 70° C. to give a polyaniline layer with a thickness of about 40 nm. The assembly was then transferred to an inert (argon) atmosphere, spin-coated (1000 RPM, 2 minutes) with a solution containing 0.5% by weight $OC_1C_{10}$-PPV (i.e., poly(2-methoxy-5-(3,7-dimethyloctyloxy)phenylvinylene), average molecular weight approximately 1,000,000) dissolved in a mixture of 20% by volume cyclohexanone and 80% by volume para-xylene, and dried under argon for 1 hour on a hot plate at 85° C. to give a $OC_1C_{10}$-PPV layer with a thickness of about 100 nm. The assembly was then transferred to a high vacuum chamber, and a first layer of calcium metal (Ca, about 200 nm) and a capping layer of aluminum metal (Al, about 1 $\mu$m) deposited by thermal evaporation under high vacuum conditions (e.g., about $10^{-7}$ Torr or less) with no additional substrate heating. The metal layer thicknesses were determined during deposition using a vibrating crystal, and were verified using a profilometer. The resulting final assembly comprised a glass substrate, an ITO layer, a polymeric polyaniline layer, a polymeric $OC_1C_{10}$-PPV layer, and a metal layer comprising a calcium layer and an aluminum layer.

The topmost metal layer (i.e., the Ca—Al layer) of the final assembly was manually scribed using three different mechanical scribing instruments. The first mechanical scribing instrument was a cylindrical stainless steel stylus 1 cm long, 1 mm in diameter, which tapered to a sharp circular tip approximately 30 $\mu$m in diameter. The second mechanical scribing instrument was a (commercially available) diamond stylus with a tip approximately 100 $\mu$m wide mounted at the end of a 15 cm handle (catalog #1015-07 from Terra Universal, Anaheim, Calif.). The third mechanical scribing instrument was the corner of a soda lime glass block with dimensions 3 cm×3 cm×1.1 mm (i.e., the same glass as used for the substrate). In all cases, approximately the same scribing speed was employed (i.e., about 1 to about 5 cm/s), with an estimated pressure of about 10 to 30 grams applied to the tip of the mechanical scribing instrument. The scribing angle was found not to be critical as long as the angle was greater than about 30° and less than about 150°.

Figure 1:
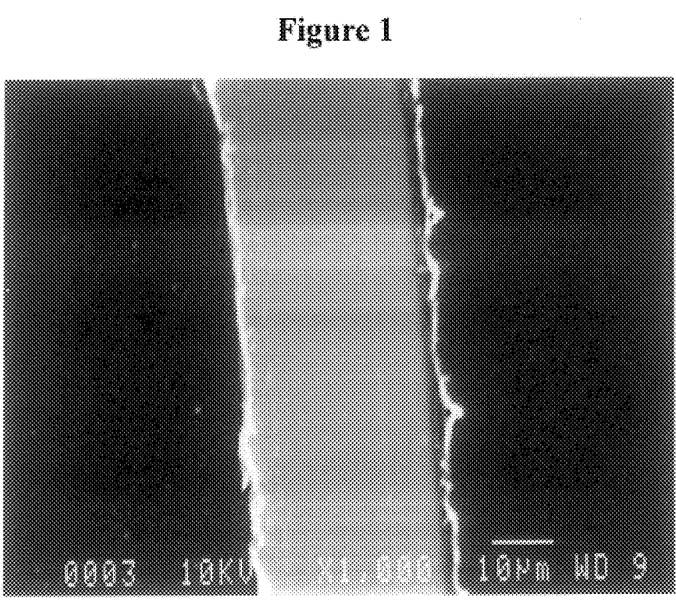
FIG. 1 is a photomicrograph of a portion of the scribe line obtained in Example 1 (i.e., glass/ITO/organic polymer/ Ca—Al) using a stainless steel stylus as a mechanical scribing instrument (#0003).
Figure 2:
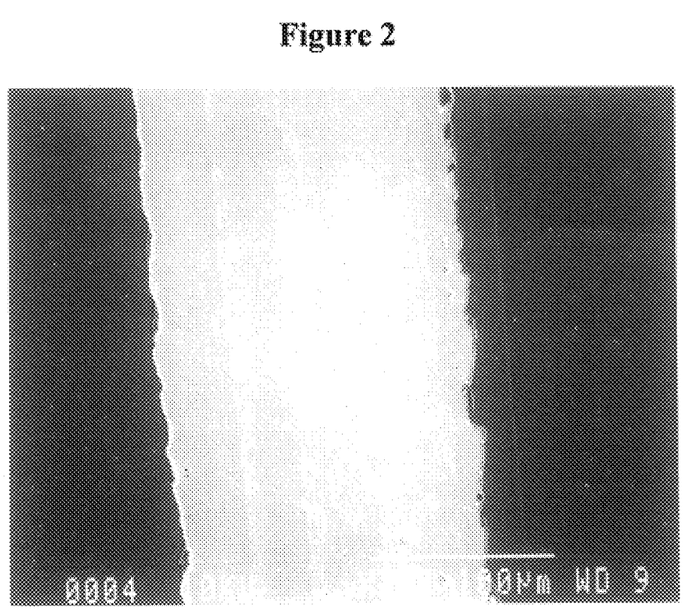
FIG. 2 is a photomicrograph of a portion of the scribe line obtained in Example 1 (i.e., glass/ITO/organic polymer/ Ca—Al) using a diamond stylus as a mechanical scribing instrument (#0004).
Figure 3:
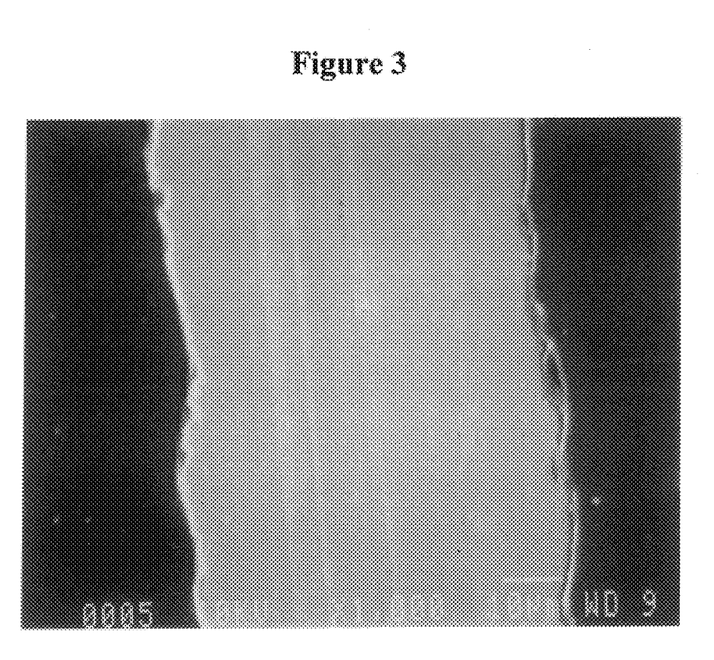
FIG. 3 is a photomicrograph of a portion of the scribe line obtained in Example 1 (i.e., glass/ITO/organic polymer/ Ca—Al) using a soda lime glass stylus as a mechanical scribing instrument (#0005).

Micrographs of portions of the scribe lines obtained using the stainless steel stylus, diamond stylus, and soda lime glass stylus are shown in FIGS. 1, 2, and 3, respectively. In each case, a scribe line was obtained which electrically isolated the metal layer (i.e., the Ca—Al layer) on either side, as determined by a measured electrical resistance of greater than 50 M$\Omega$ (using a Fluke87 multimeter). Also, in each case, the underlying ITO/polyaniline (anode) layer was relatively undamaged, in that no break in the electrical conductivity of that layer was observed. Note, however, that some scoring of the underlying ITO layer is apparent for the diamond and soda lime glass scribe lines.

In each case, a scribe line was obtained having sharp edges and little residual debris. For the stainless steel stylus, a scribe line about 30 $\mu$m wide was obtained. For the diamond stylus, a scribe line about 160 $\mu$m wide was obtained. For the soda lime glass stylus, a scribe line about 60 $\mu$m wide was obtained. The width of the scribe line primarily reflected the width of the tip of the mechanical scribing instrument; it appears that clean scribe lines as narrow as about 10 $\mu$m may be reliably obtained using an appropriately narrow mechanical scribing instrument.

Example 2

An assembly was prepared as in Example 1, except that ytterbium (Yb) was used instead of calcium (Ca). The resulting assembly was manually scribed using a stainless steel stylus, a diamond stylus, and a soda lime glass stylus, as in Example 1. The scribe lines obtained were of the nature and quality of those found in Example 1.

Example 3

An assembly was prepared as in Example 1, calcium (Ca) was not used; the topmost metal layer consisted of only an aluminum (Al) layer. The resulting assembly was manually scribed using a stainless steel stylus, a diamond stylus, and a soda lime glass stylus, as in Example 1. The scribe lines obtained were of the nature and quality of those found in Example 1.

Comparative Example 1

For comparison, an assembly consisting of a glass substrate and a 200 μm thick aluminum (Al) layer was prepared using methods analogous to those used in Example 1. Again, as in Example 1, the resulting assembly was manually scribed using a stainless steel stylus, a diamond stylus, and a soda lime glass stylus, with care exercised to employ approximately the same scribing pressure, speed, and angle as in Example 1. None of the three mechanical scribing instruments employed were able to electrically isolate the metal (aluminum) layer on either side of the scribe line; in each case, an electrical resistance of less than 2 Ω was measured across the scribe line.

Figure 4:
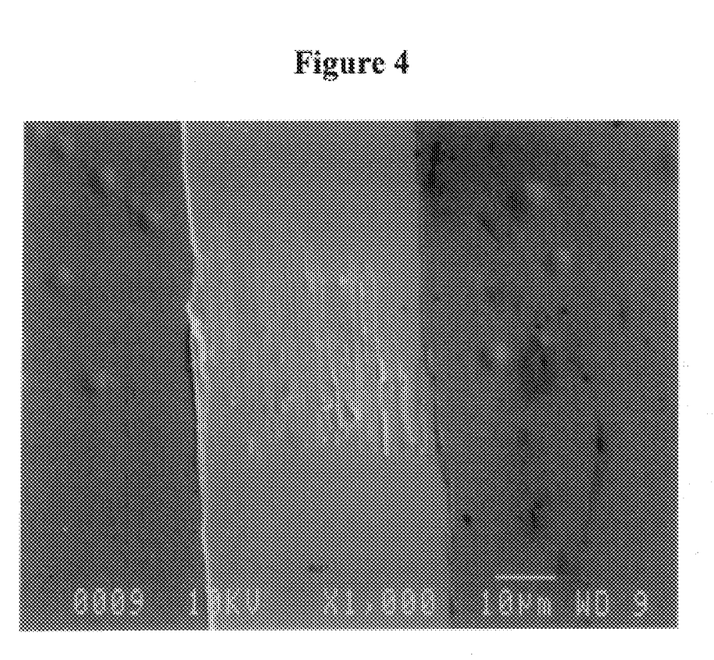
FIG. 4 is a photomicrograph of a portion of the scribe line obtained in Comparative Example 1 (i.e., glass/Al) using a stainless steel stylus as a mechanical scribing instrument (#0009).

A micrograph of a portion of the scribe line obtained using the stainless steel stylus is shown in FIG. 4. Residual metal can be seen within the scribe line. The incomplete removal of the metal within the scribe line is likely responsible for the lack of electrical isolation of the metal on either side of the scribe line.

This comparative example is demonstrative of how the absence of an underlying organic polymeric layer leads to poor results. In contrast, the presence of an underlying organic polymeric layer in conjunction with a metal overlayer facilitates the complete and clean removal of the metal within the scribe line, thus yielding a well defined, electrically isolating scribe line.

Comparative Example 2

For comparison, an assembly consisting of a glass substrate and a 100 nm thick layer of $OC_1C_{10}$-PPV polymer was prepared using methods analogous to those used in Example 1. Again, as in Example 1, the resulting assembly was manually scribed using a stainless steel stylus, with care exercised to employ approximately the same scribing pressure, speed, and angle as in Example 1.

Figure 5:
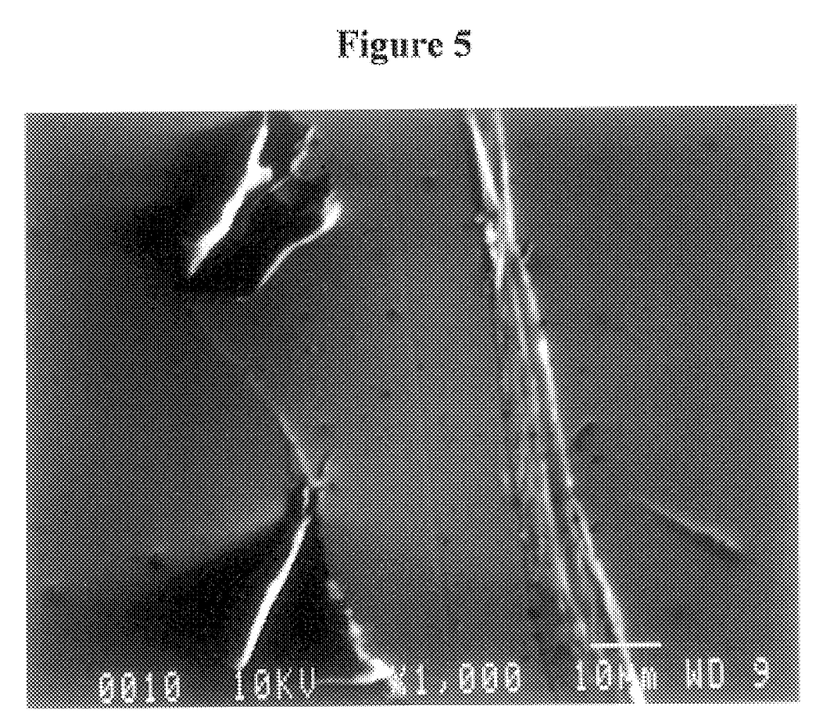
FIG. 5 is a photomicrograph of a portion of the scribe line obtained in Comparative Example 2 (i.e., glass/organic polymer) using a stainless steel stylus as a mechanical scribing instrument (#0010).

A micrograph of a portion of the resulting scribe line is shown in FIG. 5. It appears that polymeric layer has been torn and folded back by the mechanical scribing instrument to yield a scribe line with poorly defined "ragged" edges.

This comparative example is demonstrative of how the absence of a metal overlayer leads to poor results. In contrast, the presence of an underlying organic polymeric layer in conjunction with a metal overlayer facilitates the complete and clean removal of the metal within the scribe line, thus yielding a well defined, electrically isolating scribe line.

REFERENCES

The disclosures of the publications, patents, and published patent specifications referenced below are hereby incorporated by reference into the present disclosure to more fully describe the state of the art to which this invention pertains.

Abe et al., 1986, U.S. Pat. No. 4,610,079 issued Sep. 09, 1986.
Basol et al., U.S. Pat. No. 4,647,711 issued Mar. 03, 1987.
Bredas et al., (editors), 1991, *Conjugated Polymers* (Kluwer Academic Publishers, Dordrecht, Netherlands).
Crossland et al., 1983, European Patent Publication No. EP 0 072 658 published Feb. 23, 1983.
Fair et al., 1977, U.S. Pat. No. 4,033,027 issued Jul. 05, 1977.
Gay, 1987, U.S. Pat. No. 4,638,111 issued Jan. 20, 1989.
Greenham et al., 1993, "Efficient Light-Emitting Diodes Based on Polymers with High Electron Affinities," *Nature*, Vol. 365, pp. 628–630.
Lin, 1985, U.S. Pat. No. 4,502,225 issued Mar. 05, 1985.
Mignardi et al., 1997, U.S. Pat. No. 5,597,767 issued Jan. 28, 1997.
Milnes, 1984, U.S. Pat. No. 4,445,965 issued May 01, 1984.
Morel et a., U.S. Pat. No. 4,517,403 issued May 14, 1985.
Nath et al., 1988, U.S. Pat. No. 4,729,970 issued Mar. 08, 1988.
Nath et al., 1992, U.S. Pat. No. 5,084,400 issued Jan. 28, 1992.
Ondris, 1988, U.S. Pat. No. 4,785,191 issued Nov. 15, 1988.
Ondris, 1989, U.S. Pat. No. 4,826,777 issued May 02, 1989.
Steigerwald et al., 1981, U.S. Pat. No. 4,242,969 issued Jan. 06, 1981.
Stocker et al., 1994, U.S. Pat. No. 5,276,382 issued Jan. 04, 1994.
Woolhouse et al., U.S. Pat. No. 4,237,601 issued Dec. 09, 1980.
Zhang et al., 1994, "Blue Electroluminescent Diodes Utilizing Blends of Poly(p-Phenylene Vinylene) in Poly(9-Vinylcarbazole)," *Synthetic Metals*, Vol. 62, pp. 35–40.
Nalwa Hari Singh, 1997, editor, *Handbook of Organic Conductive Molecules and Polymers*, Vols. 1–4, published by John Wiley & sons, New York.
Kanatzidis, 1990, "Conductive Polymers," Chemical & Engineering News, December 1990, Vol. 68, No. 49, pp. 36–50.
Sze, 1981, *Physics of Semiconductor Devices*, 2nd edition, published by John Wiley & Sons, New York.

What is claimed is:

1. A method of forming a patterned metal layer in an electronic device, which device comprises, in contact sequence, a support layer, an organic polymeric layer, and said metal layer, said method comprising the step of:

mechanically scribing said metal layer disposed on said organic polymeric layer with a mechanical scribing instrument thereby removing unwanted portion of said metal layer and forming said patterned metal layer on said oranic polymer layer; wherein said metal layer is made of at least one metal material selected from pure metallic elements and alloys;

wherein said mechanical scribing instrument scribes through the entire thickness of said metal layer;

wherein the electrical properties of the support layer are maintained.

2. The method according to claim 1, wherein said mechanical scribing instrument is metallic.

3. The method according to claim 1, wherein said mechanical scribing instrument is stainless steel.

4. The method according to claim 1, wherein said patterned metal layer comprises one or more bars, stripes, lines, rows, or columns.

5. The method according to claim 1, wherein said mechanical scribing instrument passes through at least about 50% of said organic polymeric layer.

6. The method according to claim 1, wherein said metal layer has a thickness of about 100 Å to about 5 μm.

7. The method according to claim 1, wherein said organic polymeric layer has a thickness of about 200 Å to about 2 μm.

8. The electronic device comprising, in contact sequence, a support layer, an organic polymeric layer, and a patterned metal layer, formed by the method according to claim 1.

9. A method of forming a patterned metal layer in an electronic device comprising a support layer and said metal layer, said metal layer having an underlying surface and an opposite scribing surface, wherein the underlying surface is adjacent to the support layer, the support layer having electrical properties, said method comprising the step of:

providing an organic polymeric layer between the support layer and the metal layer the metal layer made of at least one metal material selected from pure metallic elements and metallic alloys;

mechanically scribing the scribing surface of said metal layer disposed on said organic polymeric layer with a mechanical scribing instrument, thereby removing unwanted portion of said metal layer and forming, at least one scribe lines, wherein the presence of the organic polymeric layer in conjunction with the metal layer facilitates the complete and clean removal of the unwanted portion of the metal layer within the at least one scribe lines; the     wherein said mechanical scribing instrument scribes through the entire thickness of said metal layer;

wherein the electrical properties of the support layer are maintained.

10. The method of claim 1, wherein said mechanical scribing instrument is metallic.

11. The method of claim 1, wherein said mechanical scribing instrument is stainless steel.

12. The method of claim 1, wherein said patterned layer comprises one or more bars, stripes lines, rows or columns of scribe lines.

13. The method of claim 1, wherein the organic polymer layer has a thickness, and said mechanical scribing instrument passes through at least about 50% of said thickness of the organic polymer layer.

14. The method of claim 1, wherein said metal layer has a thickness of from about 100 Angstroms to about 5 micrometers.

15. The method of claim 1, wherein said organic polymeric layer has a thickness of from about 200 Angstroms to about 2 micrometers.

\* \* \* \* \*

UNITED STATES PATENT AND TRADEMARK OFFICE
CERTIFICATE OF CORRECTION

PATENT NO.   : 6,430,810 B1
DATED        : August 13, 2002
INVENTOR(S)  : Phillip Bailey It is certified that error appears in the above-identified patent and that said Letters Patent is hereby corrected as shown below:

<u>Column 18,</u>
Line 51, delete "oranic" and insert -- organic --.

<u>Column 20,</u>
Line 2, delete "the".
Lines 7, 9, 11, 14, 18 and 21, delete "claim 1" and insert -- claim 9 --.

Signed and Sealed this

Fourth Day of November, 2003

JAMES E. ROGAN
*Director of the United States Patent and Trademark Office*